(12) United States Patent
Kong et al.

(10) Patent No.: US 10,763,128 B2
(45) Date of Patent: Sep. 1, 2020

(54) PROCESS OF SURFACE-MOUNTING THREE-DIMENSIONAL PACKAGE STRUCTURE ELECTRICALLY CONNECTED BY PREPACKAGED METAL

(71) Applicant: JIANGSU CHANGJIANG ELECTRONICS TECHNOLOGY CO., LTD., Jiangyin, Jiangsu (CN)

(72) Inventors: Haishen Kong, Jiangyin (CN); Yubin Lin, Jiangyin (CN); Jinxin Shen, Jiangyin (CN); Xinfu Liang, Jiangyin (CN); Qingyun Zhou, Jiangyin (CN)

(73) Assignee: JIANGSU CHANGJIANG ELECTRONICS TECHNOLOGY CO, LTD., Jiangyin, Jiangsu (CN)

( * ) Notice: Subject to any disclaimer, the term of this patent is extended or adjusted under 35 U.S.C. 154(b) by 0 days.

(21) Appl. No.: 16/472,160

(22) PCT Filed: Dec. 14, 2017

(86) PCT No.: PCT/CN2017/116051
§ 371 (c)(1),
(2) Date: Jun. 20, 2019

(87) PCT Pub. No.: WO2018/113574
PCT Pub. Date: Jun. 28, 2018

(65) Prior Publication Data
US 2019/0333780 A1    Oct. 31, 2019

(30) Foreign Application Priority Data
Dec. 21, 2016   (CN) .......................... 2016 1 1191648

(51) Int. Cl.
*H01L 21/48*   (2006.01)
*H01L 21/56*   (2006.01)
(Continued)

(52) U.S. Cl.
CPC ...... *H01L 21/4839* (2013.01); *H01L 21/4828* (2013.01); *H01L 21/4842* (2013.01);
(Continued)

(58) Field of Classification Search
CPC .................................................. H01L 21/4839
(Continued)

(56) References Cited

U.S. PATENT DOCUMENTS

| 7,772,681 B2 | 8/2010 | Oseob et al. |
| 2003/0006492 A1 | 1/2003 | Ogasawara et al. |

(Continued)

FOREIGN PATENT DOCUMENTS

| CN | 103681580 A | 3/2014 |
| CN | 104051443 A | 9/2014 |

(Continued)

OTHER PUBLICATIONS

International Search Report for PCT/CN2017/116051 dated Mar. 13, 2018 and its English translation provided by WIPO.
(Continued)

*Primary Examiner* — Jami Valentine Miller
(74) *Attorney, Agent, or Firm* — Ladas & Parry, LLP

(57) ABSTRACT

The present invention relates to a process of a surface-mounting three-dimensional package structure electrically connected by a pre-packaged metal, comprising: taking a metal sheet; punching or etching the metal sheet; packaging a conductive metal-pillar frame; performing windowing and slotting; taking a substrate on which a chip is surface-mounted; fitting the conductive metal-pillar frame; performing packaging and grinding; surface-mounting a passive device; performing plastic packaging and ball-mounting; and performing cutting. The process of the present invention can improve the integration level and the reliability.

8 Claims, 5 Drawing Sheets

(51) Int. Cl.
*H01L 25/16* (2006.01)
*H01L 21/60* (2006.01)

(52) U.S. Cl.
CPC .......... *H01L 21/561* (2013.01); *H01L 21/565* (2013.01); *H01L 25/165* (2013.01); *H01L 2021/60007* (2013.01)

(58) Field of Classification Search
USPC .......................................................... 438/113
See application file for complete search history.

(56) References Cited

U.S. PATENT DOCUMENTS

2009/0093361 A1\* 4/2009 Sakatani ................ B01J 35/004
502/309
2009/0229967 A1\* 9/2009 Sakatani .................. A61L 9/16
204/157.3

FOREIGN PATENT DOCUMENTS

| CN | 104659004 A | 5/2015 |
| CN | 106129016 A | 11/2016 |
| CN | 106601636 A | 4/2017 |

OTHER PUBLICATIONS

Written Opinion of the International Searching Authority for PCT/CN2017/116051 dated Mar. 13, 2018 and its English translation provided by Google Translate.

\* cited by examiner

PROCESS OF SURFACE-MOUNTING THREE-DIMENSIONAL PACKAGE STRUCTURE ELECTRICALLY CONNECTED BY PREPACKAGED METAL

CROSS-REFERENCE TO RELATED APPLICATIONS

The present application is the U.S. national phase application of PCT Application No. PCT/CN2017/116051 filed on Dec. 14, 2017, which claims priority to Chinese Patent Application No. 201611191648.7, filed on Dec. 21, 2016 and entitled "Process of surface-mounting three-dimensional package structure electrically connected by pre-packaged metal", the entire contents of which are incorporated herein by reference in their entireties.

TECHNICAL FIELD

The present invention relates to a process of a surface-mounting three-dimensional package structure electrically connected by a pre-packaged metal and belongs to the field of semiconductor packaging technologies.

BACKGROUND

In order to meet the demand for small and light semiconductor packaging, nowadays, packaging of a metal lead frame or an organic substrate is working in two directions: 1, reduction of the package size; and 2, functional integration. For reduction of the package size, there is a limited space for improvement. Thus, the packaging industry is focused on improvement of functional integration. That is, part of functional components or other electronic devices are integrated inside a substrate by means of embedding to improve the functional integration level of an entire package. However, since the substrate with the components embedded therein has more complicated and diversified interlayer materials and different materials have significantly different thermal expansion coefficients, the whole substrate is serious in warping and aggravated in layering, and even delamination may be caused.

SUMMARY

The present invention aims to solve the technical problem by providing a process of a surface-mounting three-dimensional package structure electrically connected by a pre-packaged metal for the prior at. The three-dimensional package structure allows components to be embedded therein so as to improve the functional integration level of an entire package. In the process, a pre-packaged whole-piece metal-pillar frame or a single pre-packaged metal pillar is taken for interlayer conduction, such that the product reliability can be improved.

The present invention adopts the following technical solution to solve the problem: a process of a surface-mounting three-dimensional package structure electrically connected by a pre-packaged metal includes:

step 1, taking a metal sheet;

step 2, punching or etching the metal sheet:

punching or etching the metal sheet to form a conductive metal-pillar frame to facilitate follow-up interlayer conduction;

step 3, packaging the conductive metal-pillar frame:

performing plastic packaging on a hollow portion in the middle of the conductive metal-pillar frame and protecting the periphery of a metal pillar by a molding compound;

step 4, performing windowing and slotting:

windowing a required portion of the plastically-packaged conductive metal-pillar frame;

step 5, taking a substrate on which a chip is surface-mounted;

step 6, fitting the conductive metal-pillar frame:

printing the conductive metal-pillar frame on the substrate by a solder paste or fitting the conductive metal-pillar frame to the substrate by a conductive adhesive for partially electrical connection with the substrate, wherein the windowed portion exactly accommodates the chip on the substrate;

step 7, performing packaging and grinding:

performing plastic packaging on the front side of the substrate by a molding compound and performing grinding to expose a surface of the conductive metal-pillar frame;

step 8, surface-mounting a passive device:

surface-mounting the passive device on the ground conductive metal-pillar frame;

step 9, performing plastic packaging and ball-mounting:

performing plastic packaging on the surface of the substrate, on which the passive device is mounted, and performing ball-mounting on a lower surface of the substrate; and step 10, performing cutting:

cutting the plastically-packaged substrate into single products.

A process of a surface-mounting three-dimensional package structure electrically connected by a pre-packaged metal includes:

step 1, taking a metal sheet;

step 2, punching or etching the metal sheet:

punching or etching the metal sheet to form a conductive metal-pillar frame to facilitate follow-up interlayer conduction;

step 3, packaging the conductive metal-pillar frame;

performing plastic packaging on the conductive metal-pillar frame and protecting the periphery and an upper surface of a metal pillar by a molding compound;

step 4, performing windowing and slotting:

windowing a required portion of the plastically-packaged conductive metal-pillar frame;

step 5, fitting the conductive metal-pillar frame:

taking a substrate on which a chip is surface-mounted, and printing the conductive metal-pillar frame on the substrate by a solder paste or fitting the conductive metal-pillar frame to the substrate by a conductive adhesive for partially electrical connection with the substrate, wherein the windowed portion exactly accommodates the chip on the substrate;

step 6, performing packaging and grinding:

performing plastic packaging on the front side of the substrate by a molding compound and performing grinding to expose a surface of the conductive metal-pillar frame;

step 7, surface-mounting a passive device and performing packaging and ball-mounting:

mounting the passive device on the surface of the ground conductive metal-pillar frame, performing plastic packaging on the surface of the substrate, on which the passive device is mounted, and performing ball-mounting on a lower surface of the substrate; and step 8, performing cutting:

cutting the plastically-packaged substrate into single products.

A process of a surface-mounting three-dimensional package structure electrically connected by a pre-packaged metal includes:

step 1, taking a metal sheet;

step 2, forming a metal-pillar circuit layer on a surface of the metal sheet by electroplating:

forming a circuit layer on the surface of the metal sheet by electroplating and forming a conductive copper pillar above the circuit layer by electroplating;

step 3, performing plastic packaging on the metal-pillar circuit layer:

protecting the metal-pillar circuit layer on the surface of the metal sheet by a molding compound;

step 4, performing windowing:

windowing a required portion of the plastically-packaged metal-pillar circuit layer;

step 5, removing the metal sheet;

step 6, fitting the metal-pillar circuit layer and performing plastic packaging:

taking a substrate on which a chip is surface-mounted, printing the metal-pillar circuit layer on the substrate by a solder paste or fitting the metal-pillar circuit layer to the substrate by a conductive adhesive for partially electrical connection with the substrate, performing the plastic packaging on an exposed portion of the chip for protection and performing grinding to expose an upper surface of the metal-pillar circuit layer, wherein the windowed portion exactly accommodates the chip on the substrate;

step 7, surface-mounting a passive device, and performing packaging and ball-mounting:

mounting the passive device on the upper surface of the metal-pillar-circuit layer, performing packaging on the surface of the substrate, on which the passive device is mounted, and performing ball-mounting on a lower surface of the substrate; and step 8, performing cutting:

cutting the plastically-packaged substrate into single products.

A chip, a passive component or a heat-dissipation device, or a combination thereof is surface-mounted on the substrate.

The plastic packaging adopts glue filling by a mold, compression glue filling, spray-coating or filming.

Compared with the prior art, the present invention has the following advantages:

1. According to the process flow of the three-dimensional package structure, provided by the present invention, objects are embedded during manufacture of intermediate interlayers of a substrate. An active or passive component may be embedded into a required position or region according to system or functional demands. A packaged and integrated system has more functions. Thus, a component module with the same function takes up less space on a PCB. Accordingly, the cost is lowered and the packaging integration level is improved.

2. According to the process flow provided by the present invention, the pre-packaged metal-pillar frame is adopted for interlayer conduction, so that the binding property of the metal pillar with the molding compound can be improved. The molding compound for pre-package can play a buffering role in the follow-up package process. Thus, such defects as delamination and vertical fracture, caused by different shrinkage percentages of a metal and the molding compound, can be prevented.

3. According to the three-dimensional package structure provided by the present invention, the pre-packaged metal-pillar frame is designed with a relatively higher degree of freedom, such that an interlayer conduction circuit can be designed in accordance with different package requirements. Thus, the applicability is extremely wide.

DETAILED DESCRIPTION

The embodiments of the present invention will be further described in detail below with reference to the accompanying drawings.

Embodiment 1

Figure 1:
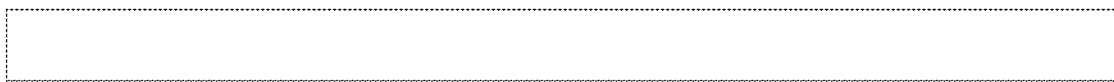
FIGS. 1-10 are schematic views of all procedures of a process of a surface-mounting three-dimensional package structure electrically connected by a pre-packaged metal according to Embodiment 1 of the present invention.
Figure 2:
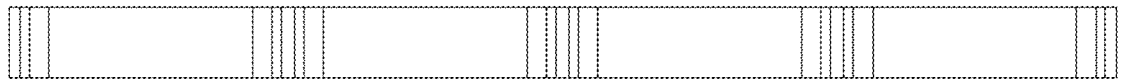
Figure 2:
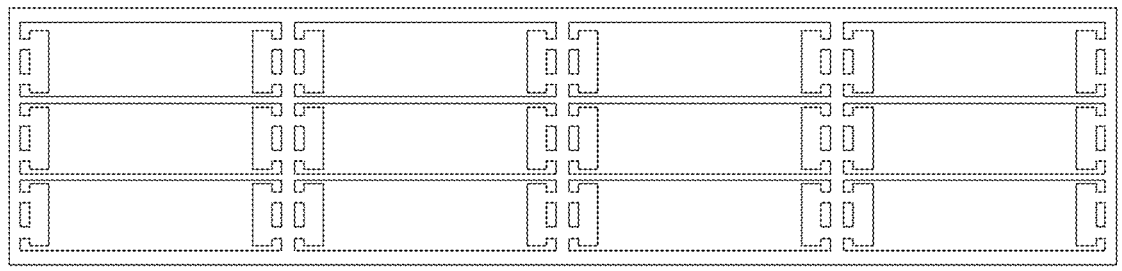
Figure 3:
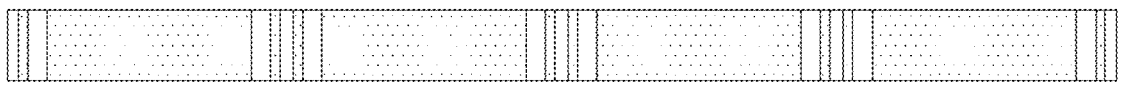
Figure 3:
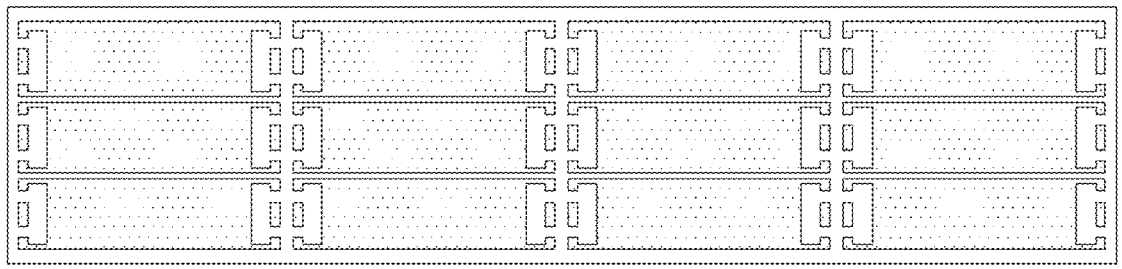
Figure 4:
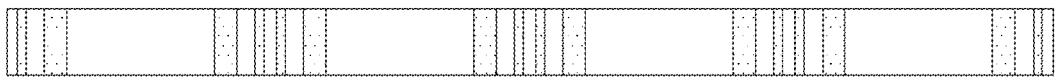
Figure 4:
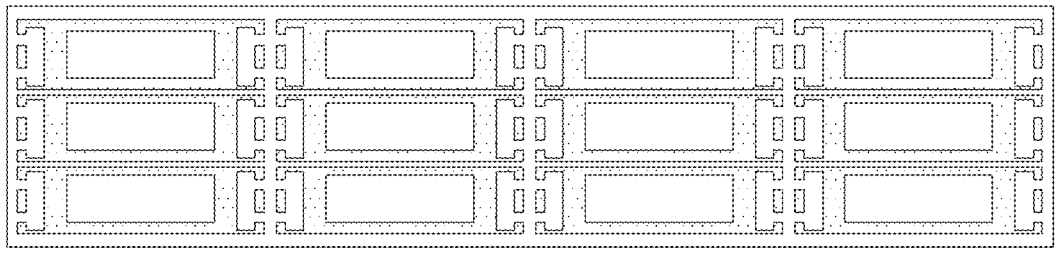
Figure 5:
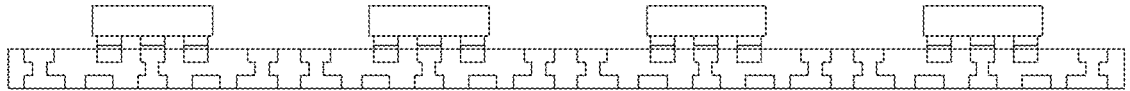
Figure 6:
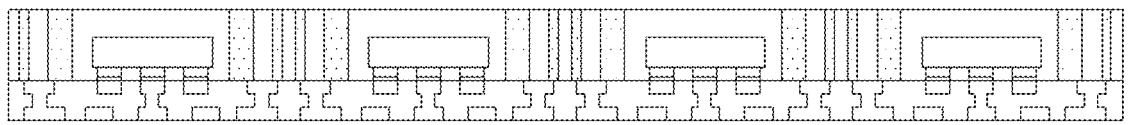
Figure 7:
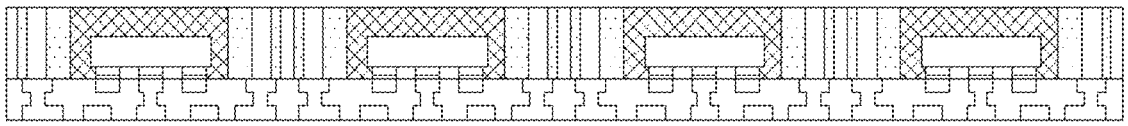
Figure 8:
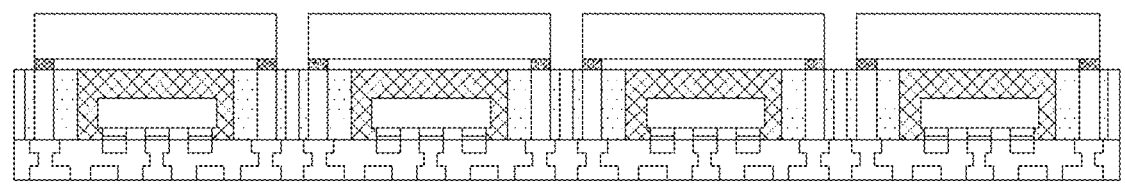
Figure 9:
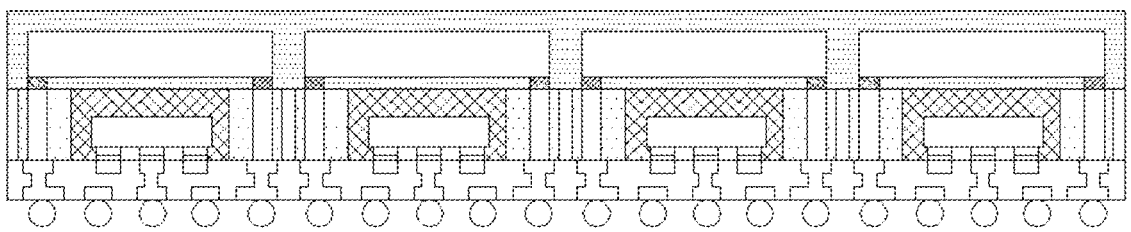
Figure 10:
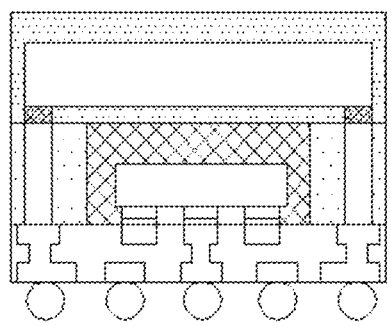
Figure 10:
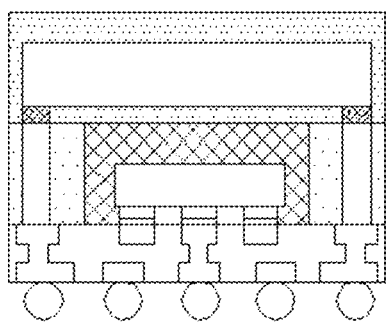

The present invention provides a process of a surface-mounting three-dimensional package structure electrically connected by a pre-packaged metal, including:

step 1, taking a metal sheet:

referring to FIG. 1, taking the metal sheet with an appropriate thickness;

step 2, punching or etching the metal sheet:

referring to FIG. 2, punching or etching the metal sheet to form a conductive metal-pillar frame to facilitate follow-up interlayer conduction, wherein the shape formed by punching and etching may be diversified, may be a metal pillar or other irregular shapes and may also be a simple circuit shape;

step 3, packaging the conductive metal-pillar frame:

referring to FIG. 3, performing plastic packaging on a hollow portion in the middle of the conductive metal-pillar frame, and protecting the periphery of a metal pillar by a molding compound, wherein plastic packaging does not need to be performed on an upper surface and a lower surface of the metal pillar;

step 4, performing windowing and slotting:

referring to FIG. 4, windowing a required portion of the plastically-packaged conductive metal-pillar frame;

step 5, taking a substrate on which a chip is surface-mounted:

referring to FIG. 5, taking the substrate on which a chip, a passive component or a heat-dissipation device or a combination thereof is surface-mounted;

step 6, fitting the conductive metal-pillar frame:

referring to FIG. 6, printing the conductive metal-pillar frame on the substrate by a solder paste or fitting the conductive metal-pillar frame to the substrate by a conductive adhesive for partially electrical connection with the substrate, wherein the windowed portion exactly accommodates the chip on the substrate;

step 7, performing packaging and grinding:

referring to FIG. 7, performing plastic packaging on the front side of the substrate by a molding compound and performing grinding to expose a surface of the conductive metal-pillar frame, wherein the plastic packaging may adopt glue filling by a mold, compression glue filling, spray-coating or filming, the molding compound may be epoxy resin with or without a filling substance, and this step can be omitted;

step 8, surface-mounting a passive device:

referring to FIG. 8, surface-mounting the passive device on the ground conductive metal-pillar frame, wherein it is certainly not limited to the passive device, and a required functional chip or an entire package may also be surface-mounted;

step 9, performing plastic packaging and ball-mounting:

referring to FIG. 9, performing plastic packaging on the surface of the substrate, on which the passive device is mounted, and performing ball-mounting on a lower surface of the substrate; and step 10, performing cutting:

referring to FIG. 10, cutting the plastically-packaged substrate into single products.

Embodiment 2

Figure 11:
FIGS. 11-18 are schematic views of all procedures of a process of a surface-mounting three-dimensional package structure electrically connected by a pre-packaged metal according to Embodiment 2 of the present invention.
Figure 12:
Figure 13:
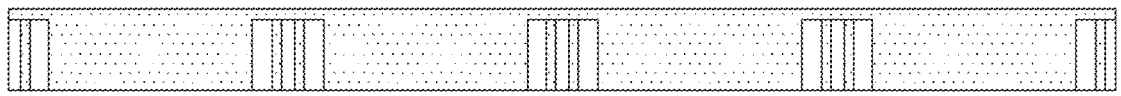
Figure 14:
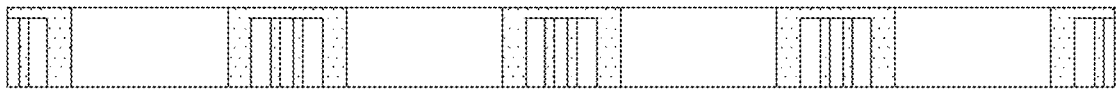
Figure 15:
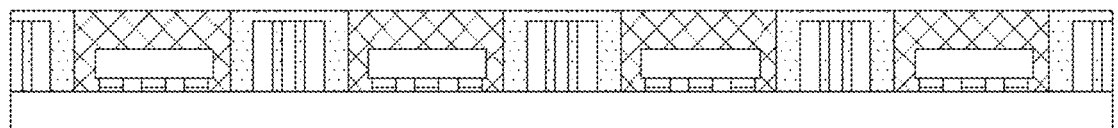
Figure 16:
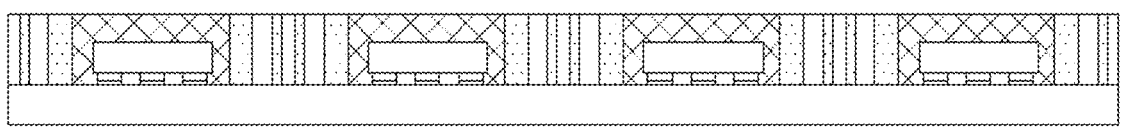
Figure 17:
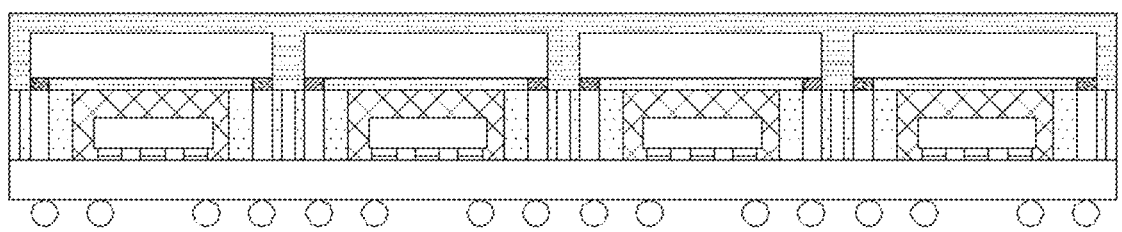
Figure 18:
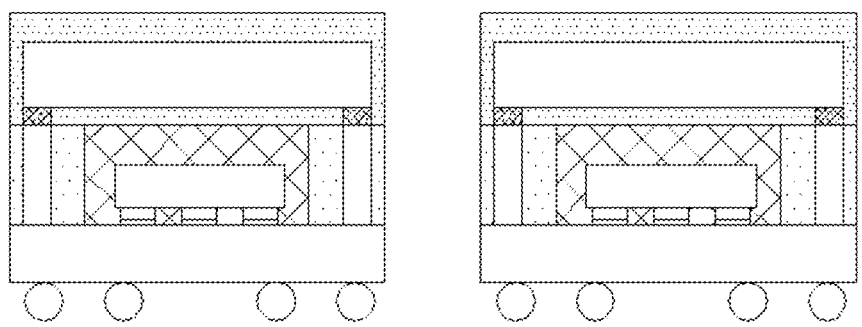

The present invention provides a process of a surface-mounting three-dimensional package structure electrically connected by a pre-packaged metal, including:

step 1, taking a metal sheet:

referring to FIG. 11, taking the metal sheet with an appropriate thickness;

step 2, punching or etching the metal sheet:

referring to FIG. 12, punching or etching the metal sheet to form a conductive metal-pillar frame to facilitate follow-up interlayer conduction, wherein the shape formed by punching and etching may be diversified, may be a metal pillar or other irregular shapes, and may also be a simple circuit shape;

step 3, packaging the conductive metal-pillar frame;

referring to FIG. 13, performing plastic packaging on the conductive metal-pillar frame and protecting the periphery and an upper surface of a metal pillar by a molding compound, wherein this plastic packaging method is simple and can be implemented by a conventional plastic packaging mold;

step 4, performing windowing and slotting:

referring to FIG. 14, windowing a required portion of the plastically-packaged conductive metal-pillar frame;

step 5, fitting the conductive metal-pillar frame:

referring to FIG. 15, taking a substrate on which a chip, a passive component or a heat-dissipation device or a combination thereof is surface-mounted, and printing the conductive metal-pillar frame on the substrate by a solder paste or fitting the conductive metal-pillar frame to the substrate by a conductive adhesive for partially electrical connection with the substrate, wherein the windowed portion exactly accommodates the chip on the substrate;

step 6, performing packaging and grinding:

referring to FIG. 16, performing plastic packaging on the front side of the substrate by a molding compound and performing grinding to expose a surface of the conductive metal-pillar frame, wherein the plastic packaging may adopt glue filling by a mold, compression glue filling, spray-coating or filling, the molding compound may be epoxy resin with or without a filling substance, and this step can be omitted;

step 7, surface-mounting a passive device and performing packaging and ball-mounting:

referring to FIG. 17, mounting the passive device on the surface of the ground conductive metal-pillar frame, performing plastic packaging on the surface of the substrate, on which the passive device is mounted, and performing ball-mounting on a lower surface of the substrate, wherein it is certainly not limited to the passive device, and a required functional chip or an entire package may also be surface-mounted; and step 8, performing cutting:

referring to FIG. 18, cutting the plastically-packaged substrate into single products.

Figure 19:
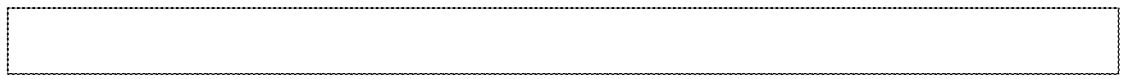
FIGS. 19-26 are schematic views of all procedures of a process of a surface-mounting three-dimensional package structure electrically connected by a pre-packaged metal according to Embodiment 3 of the present invention.
Figure 20:
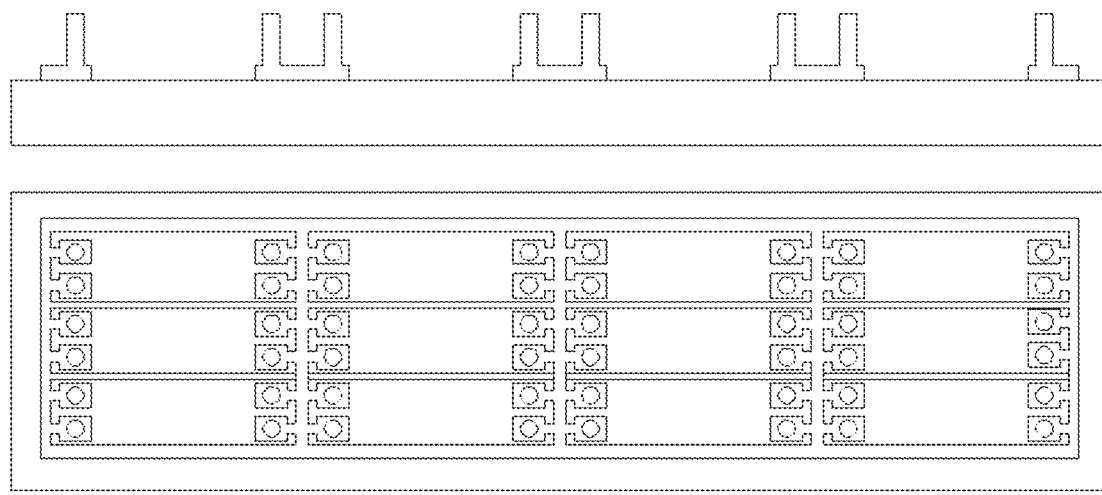
Figure 21:
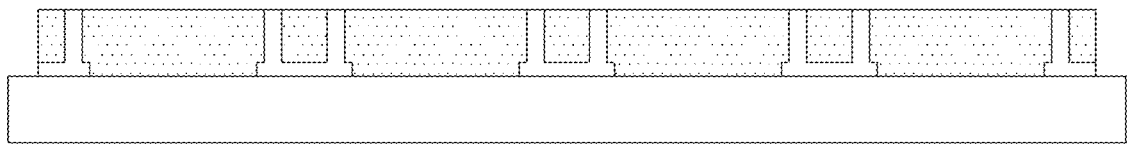
Figure 22:
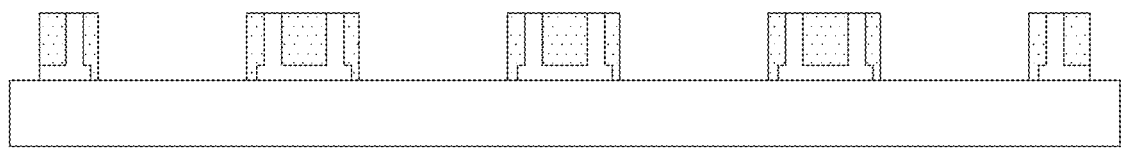
Figure 23:
Figure 24:
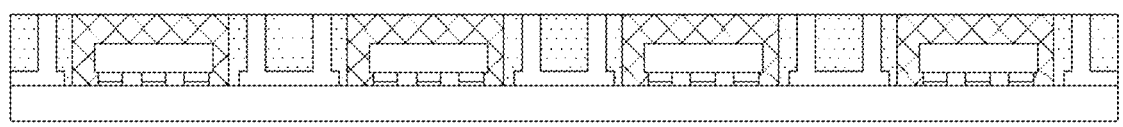
Figure 25:
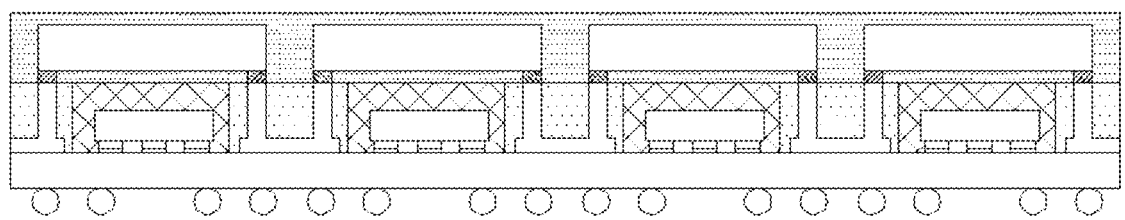
Figure 26:
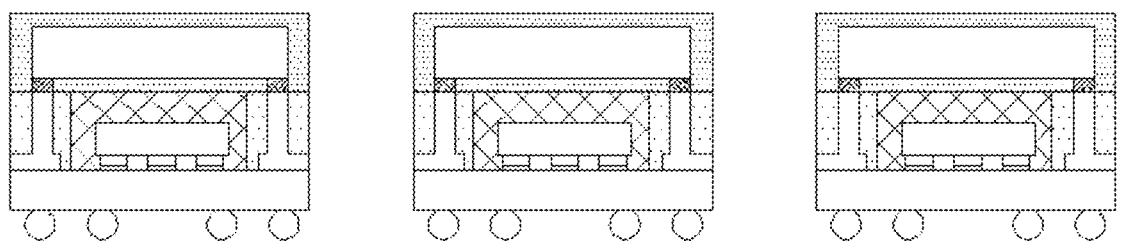

Embodiment 3 step 1, taking a metal sheet:

referring to FIG. 19, taking the metal sheet with an appropriate thickness;

step 2, forming a metal-pillar circuit layer on a surface of the metal sheet by electroplating:

referring to FIG. 20, forming a circuit layer on the surface of the metal sheet by electroplating and forming a conductive copper pillar above the circuit layer by electroplating;

step 3, performing plastic packaging on the metal-pillar circuit layer:

referring to FIG. 21, protecting the metal-pillar circuit layer on the surface of the metal sheet by a molding compound;

step 4, performing windowing:

referring to FIG. 22, windowing a required portion of the plastically-packaged metal-pillar circuit layer;

step 5, removing the metal sheet:

referring to FIG. 23, removing the metal sheet, wherein the remaining metal-pillar circuit layer is still in an entire frame shape;

step 6, fitting the metal-pillar circuit layer and performing plastic packaging:

referring to FIG. 24, taking a substrate on which a chip, a passive device or a heat-dissipation device and a combination thereof is surface-mounted, printing the metal-pillar circuit layer on the substrate by a solder paste or fitting the metal-pillar circuit layer to the substrate by a conductive adhesive for partially electrical connection with the substrate, performing the plastic packaging on an exposed portion of the chip for protection, and performing grinding to expose an upper surface of the metal-pillar circuit layer, wherein the windowed portion exactly accommodates the chip on the substrate;

step 7, surface-mounting a passive device, and performing packaging and ball-mounting:

referring to FIG. 25, mounting the passive device on the upper surface of the metal-pillar-circuit layer, performing plastic packaging on the surface of the substrate, on which the passive device is mounted, and performing ball-mounting on a lower surface of the substrate, wherein it is certainly not limited to the passive device, and a required functional chip or an entire package may also be surface-mounted; and step 8, performing cutting:

referring to FIG. 26, cutting the plastically-packaged substrate into single products.

In addition to the above embodiments, the present invention also includes other embodiments, and any technical solution formed by equivalent transformations or equivalent substitutions should fall within the protection scope defined by the claims of the present invention.

The invention claimed is:

1. A process of a surface-mounting three-dimensional package structure electrically connected by a prepackaged metal, comprising:

step 1, taking a metal sheet;

step 2, punching or etching the metal sheet:

punching or etching the metal sheet to form a conductive metal-pillar frame to facilitate follow-up interlayer conduction;

step 3, packaging the conductive metal-pillar frame;

step 4, performing windowing and slotting:

windowing a required portion of the plastically-packaged conductive metal-pillar frame;

step 5, taking a substrate on which a chip is surface-mounted;

step 6, fitting the conductive metal-pillar frame:

printing the conductive metal-pillar frame on the substrate by a solder paste or fitting the conductive metal-pillar frame to the substrate by a conductive adhesive for partially electrical connection with the substrate, wherein the windowed portion exactly accommodates the chip on the substrate;

step 7, performing packaging and grinding:

performing plastic packaging on the front side of the substrate by a molding compound and performing grinding to expose a surface of the conductive metal-pillar frame;

step 8, surface-mounting a passive device:

surface-mounting the passive device on the ground conductive metal-pillar frame;

step 9, performing plastic packaging and ball-mounting:

performing plastic packaging on the surface of the substrate on which the passive device is mounted, and performing ball-mounting on a lower surface of the substrate; and step 10, performing cutting:

cutting the plastically-packaged substrate into single products.

2. The process of a surface-mounting three-dimensional package structure electrically connected by a prepackaged metal according to claim 1, wherein step 3 particularly comprises the sub-steps of performing plastic packaging on a hollow portion in the middle of the conductive metal-pillar frame and protecting the periphery of a metal pillar by a molding compound.

3. The process of a surface-mounting three-dimensional package structure electrically connected by a prepackaged metal according to claim 1, wherein step 3 particularly comprises the sub-steps of performing plastic packaging on the conductive metal-pillar frame and protecting the periphery and an upper surface of a metal pillar by a molding compound.

4. The process of a surface-mounting three-dimensional package structure electrically connected by a prepackaged metal according to claim 1, wherein a chip, a passive component, or a heat-dissipation device or a combination thereof is surface-mounted on the substrate.

5. The process of a surface-mounting three-dimensional package structure electrically connected by a prepackaged metal according to claim 1, wherein the plastic packaging adopts glue filling by a mold, compression glue filling, spray-coating or filming.

6. A process of a surface-mounting three-dimensional package structure electrically connected by a pre-packaged metal, comprising:

step 1, taking a metal sheet;

step 2, forming a metal-pillar circuit layer on a surface of the metal sheet by electroplating:

forming a circuit layer on the surface of the metal sheet by electroplating and forming a conductive copper pillar above the circuit layer by electroplating;

step 3, performing plastic packaging on the metal-pillar circuit layer:

protecting the metal-pillar circuit layer on the surface of the metal sheet by a molding compound;

step 4, performing windowing:

windowing a required portion of the plastically-packaged metal-pillar circuit layer;

step 5, removing the metal sheet;

step 6, fitting the metal-pillar circuit layer and performing plastic packaging:

taking a substrate on which a chip is surface-mounted, printing the metal-pillar circuit layer on the substrate by a solder paste or fitting the metal-pillar circuit layer to the substrate by a conductive adhesive for partially electrical connection with the substrate, performing the plastic packaging on an exposed portion of the chip for protection, and performing grinding to expose an upper surface of the metal-pillar circuit layer, wherein the windowed portion exactly accommodates the chip on the substrate;

step 7, surface-mounting a passive device, and performing packaging and ball-mounting:

mounting the passive device on the upper surface of the metal-pillar-circuit layer, performing plastic packaging on the surface of the substrate, on which the passive device is mounted, and performing ball-mounting on a lower surface of the substrate;

step 8, performing cutting:

cutting the plastically-packaged substrate into single products.

7. The process of a surface-mounting three-dimensional package structure electrically connected by a pre-packaged metal according to claim 6, wherein a chip, a passive component or a heat-dissipation device or a combination thereof is surface-mounted on the substrate.

8. The process of a surface-mounting three-dimensional package structure electrically connected by a pre-packaged metal according to claim 6, wherein the plastic packaging adopts glue filling by a mold, compression glue filling, spray-coating or filming.

* * * * *